(12) United States Patent
Lucas et al.

(10) Patent No.: US 6,642,632 B2
(45) Date of Patent: Nov. 4, 2003

(54) EFFICIENT BATTERY TRANSFER CIRCUIT

(75) Inventors: Christopher Graham Lucas, Arnprior (CA); Scott Richard Burton, Ottawa (CA)

(73) Assignee: Mitel Knowledge Corporation, Ontario (CA)

( * ) Notice: Subject to any disclaimer, the term of this patent is extended or adjusted under 35 U.S.C. 154(b) by 170 days.

(21) Appl. No.: 09/881,305

(22) Filed: Jun. 13, 2001

(65) Prior Publication Data

US 2002/0030412 A1 Mar. 14, 2002

(30) Foreign Application Priority Data

Jun. 22, 2000 (GB) ................................... 0015152

(51) Int. Cl.[7] ................................................. H02J 9/00
(52) U.S. Cl. .............................. 307/64; 307/23; 307/45; 307/46; 307/65; 307/80
(58) Field of Search .............................. 307/65, 23, 46, 307/45, 80, 64

(56) References Cited

U.S. PATENT DOCUMENTS

| 5,161,097 A | * | 11/1992 | Ikeda ........................... 363/124 |
| 5,761,061 A | | 6/1998 | Amano |
| 5,811,895 A | * | 9/1998 | Suzuki et al. ................. 307/125 |
| 6,060,789 A | | 5/2000 | Yamaguchi |
| 6,225,708 B1 | * | 5/2001 | Furukawa et al. ............. 307/66 |

FOREIGN PATENT DOCUMENTS

GB          0015152.2          12/2000

* cited by examiner

*Primary Examiner*—Gregory J. Toatley, Jr.
*Assistant Examiner*—Robert L DeBeradinis
(74) *Attorney, Agent, or Firm*—Marger Johnson & McCollom, P.C.

(57) ABSTRACT

The present invention is a battery transfer circuit connected to a load, a power supply for powering the load with at least a minimum supply voltage during normal operating conditions, and a source of battery voltage for powering the load during a power fail condition when the power supply is unable to power said load at the minimum supply voltage. The battery transfer circuit comprises a first circuit for applying at least the minimum supply voltage to the load during normal operating conditions and a second circuit for charging the battery to an optimal voltage greater than the minimum supply voltage and for down-regulating the optimal charge voltage to a predetermined voltage and for applying the predetermined voltage to the load during the power fail condition, wherein the predetermined voltage is less than the minimum supply voltage.

7 Claims, 4 Drawing Sheets

EFFICIENT BATTERY TRANSFER CIRCUIT

FIELD OF THE INVENTION

The present invention relates in general to power transfer and more specifically to a battery transfer circuit for powering an electronic device during operating and power failure conditions.

BACKGROUND OF THE INVENTION

There are many prior art circuits that provide power to an electronic device when a connected power supply experiences a power failure or disturbance. When the power failure occurs, a battery, located within the electronic device, provides backup power to the electronic device. Although the battery is used to provide backup power, prior art circuits are unable to inhibit unwanted battery operation. Unwanted battery operation occurs when the battery supplies power to the electronic device during normal operating conditions due to load and line regulation characteristics of the wall-adapter or transformer-type power supply.

SUMMARY OF THE INVENTION

The present invention is directed at a battery transfer circuit for powering an electronic device and charging an internal battery from a power supply during normal operating conditions and for providing back-up power from the internal battery to the electronic device when a power failure or disturbance condition is sensed. The present invention is also easily adaptable to different power levels and provides a configurable output voltage threshold for battery operation as a result of the power failure to prevent unwanted battery operation due to line and load regulation characteristics of the power supply.

Another advantage of the circuit of the present invention is that it provides an instant transition from power supply, or normal, operation to battery, or power failure, operation without transfer circuit delays to overcome an electronic device reset due to the voltage drop-out experienced during a power failure. Also, the present invention provides a means for increasing battery run time during power failure operation by switching out series elements between the battery and the electronic device during a prolonged power failure.

The present invention also includes circuitry to sense the output voltage of the power supply to determine when a power failure or disturbance occurs.

According to an aspect of the present invention there is provided:

A battery transfer circuit connected to a load, a power supply for powering said load with at least a minimum supply voltage during normal operating conditions, and a source of battery voltage for powering said load during a power fail condition when said power supply is unable to power said load at said minimum supply voltage, said battery transfer circuit comprising:
a first circuit for applying at least said minimum supply voltage to said load during said normal operating conditions;
a second circuit for charging said battery to an optimal voltage greater than said minimum supply voltage and for down-regulating said optimal charge voltage to a predetermined voltage and for applying said predetermined voltage to said load during said power fail condition, wherein said predetermined voltage is less than said minimum supply voltage.

BRIEF DESCRIPTION OF THE DETAILED DRAWINGS

Embodiments of the present invention will now be described with reference to the accompanying drawings in which.

DETAILED DESCRIPTION OF THE PREFERRED EMBODIMENTS

Figure 1:
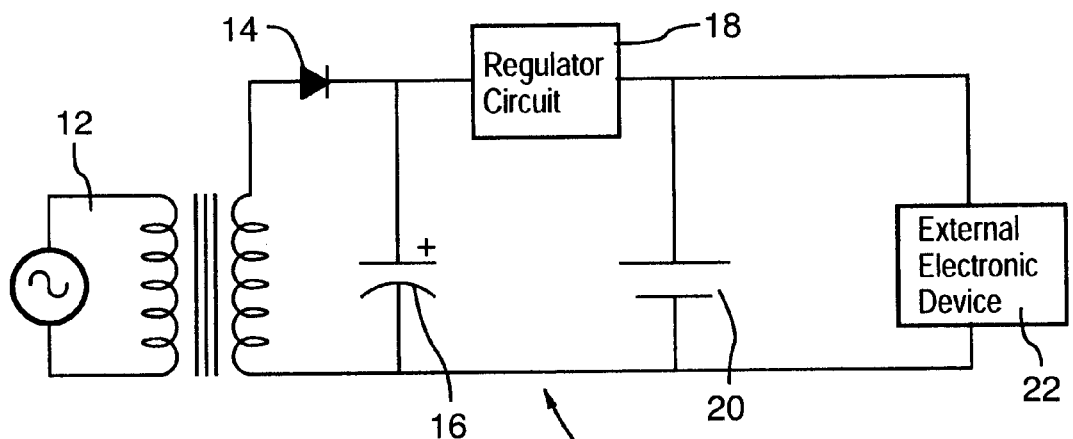
FIGS. 1 to 3 are schematic diagrams of prior art battery transfer circuits.
Figure 2:
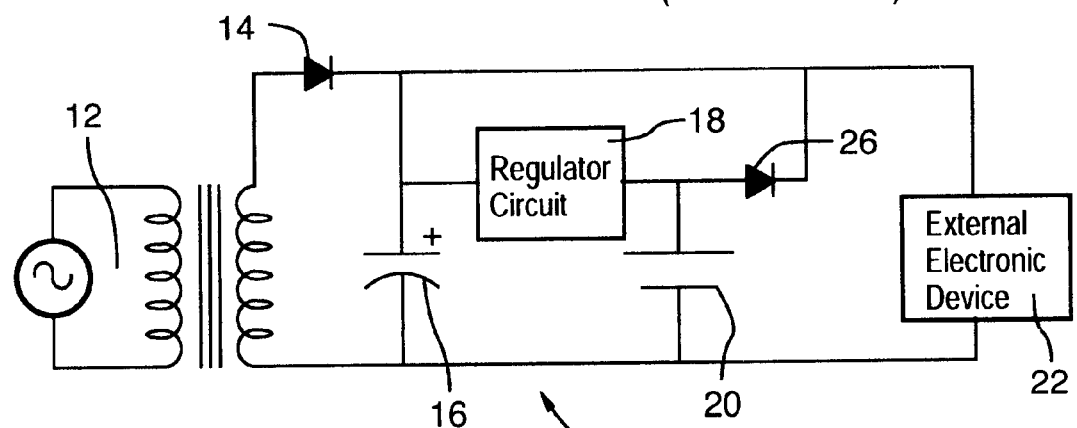
Figure 3:
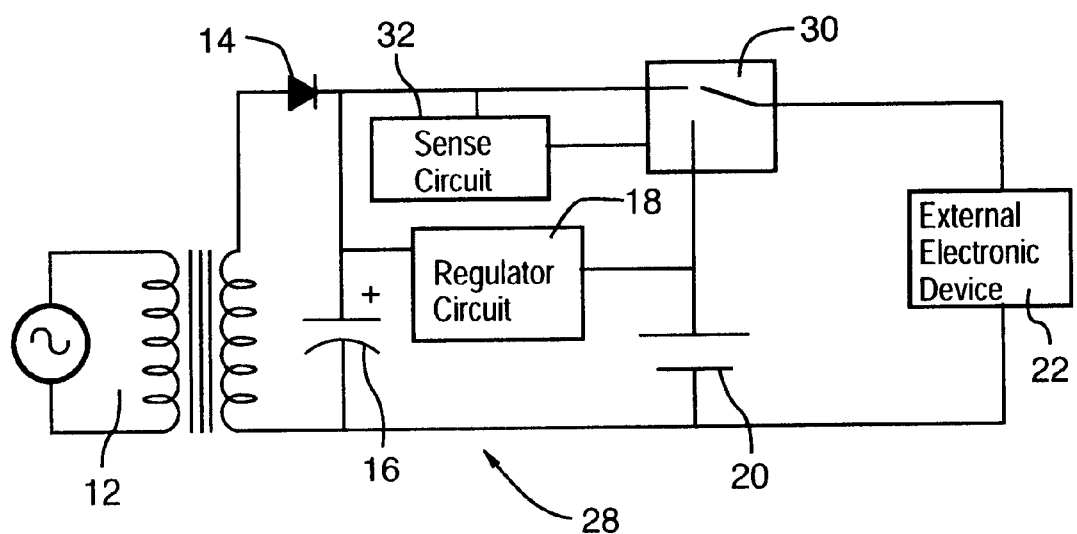

Turning to FIGS. 1 to 3, prior art battery transfer circuits are shown. In a first prior art example, as shown in FIG. 1, the circuit 10 rectifies and filters an output from a power supply 12 via a diode 14 and a capacitor 16. This rectified and filtered output is then used to power a regulator circuit 18 which, in turn, provides an optimal charge voltage to charge a battery 20 and to power an electronic device 22. In the case of a power failure or disturbance, the battery 20 automatically provides a battery charging current to the electronic device 22. However, when the output from the power supply 12 is converted to the optimal charge voltage, a loss in efficiency is experienced due to voltage drops in the regulator circuit 18. Also, since the battery 20 is directly connected to the regulator circuit 18, control of the battery charging current is not possible.

Limiting the battery charging current as a function of battery size and type is a requirement to provide maximum battery service life. In order to satisfy this requirement, a typical solution is to add a series impedance between the battery 20 and the regulator circuit 18 to limit the battery charging current. However, this results in the circuit 10 experiencing a decreased efficiency and reduced run time, increased battery charging time and decreased battery output voltage and current during power failure operation.

The size of the battery 20 may also be pre-selected to set a maximum battery charging current in relation to the load requirement of the electronic device 22. However, if the load requirement of the electronic device 22 increases, the size of the power supply 12 must also be increased requiring a larger battery to meet the increased battery charging current available from the regulator circuit 18.

A second prior art circuit 24 is shown in FIG. 2. As before, the output from the power supply 12 is rectified and filtered by the diode 14 and the capacitor 16. In this circuit 24, the rectified and filtered output is directly provided to the electronic device 22 as well as to the regulator circuit 18 for supplying the optimal charge voltage to charge the battery 20. The battery 20 is connected to the electronic device 22 via a second diode 26 which isolates the battery from unregulated rectified and filtered output and prevents overcharging of the battery when the unregulated rectified and filtered output is at a higher voltage than the optimal charge voltage of the battery 20. During a power failure or disturbance, the rectified and filtered output drops below a battery float voltage (battery output voltage+(voltage drop across the second diode 26)) and the battery 20 automatically provides the battery charging current. By directly supplying the rectified and filtered output to the electronic device 22, the efficiency loss of a voltage regulating stage is avoided. As a result, a smaller power supply 12 may be used. The optimal charge voltage may also be limited to charge the battery 20 to avoid exceeding its maximum charge rate. By isolating the battery 20 from the electronic device 22, this circuit 24 can be adapted to various power levels without necessarily having to provide a smaller or larger battery due to charging rate requirements. However, in order to avoid unwanted battery operation, the rectified and filtered output voltage is required to be higher than the battery float voltage minus one diode drop under all line and load conditions. The result is that most designs of this type tend to operate efficiently at nominal line and load conditions but operates on battery under low AC line high load conditions. This results in drastically reduced holdover time and shortened battery life. Holdover time is the length of time that the electronic device is capable of battery operation before the battery is drained.

Yet another prior art circuit 28 is shown in FIG. 3. As before, the output from the power supply 12 is rectified and filtered by the diode 14 and the capacitor 16. In this circuit, the rectified and filtered output is supplied to a switch or relay 30 and a sense circuit 32 as well as to the regulator circuit 18. The switch or relay 30 is controlled by the sense circuit 32. The output from the regulator circuit 18 provides a optimal charge voltage suitable for charging the battery 20. When a power failure or disturbance occurs, the sense circuit 32 causes the switch 30 to switch from the rectified and filtered output voltage to the battery charging current. This allows operation of the battery 20 to be controlled by the sense circuit 32 and to not be subject to voltage regulation characteristics of the power supply 12. Also, the optimal charge voltage can be current limited to charge the battery 20 without exceeding its maximum charge rate. By isolating the battery 20 from the electronic device 22, this design approach can also be adapted to various power levels without having to provide a smaller or larger battery due to charging rate requirements. However, the sense circuit 32 and the switch 30 cannot instantaneously switch from power supply operation to battery operation after the power failure or disturbance is sensed, due to circuit time delays. The result is that no power is supplied to the electronic device 22 for a brief period of time until the sense circuit 32 and the switch 30 have time to operate and switch over. Most electronic devices 22 powered by the power supply 12 do not have sufficient energy storage to prevent a reset or loss of data under these conditions. Some designs of this type attempt to compensate for the time delay in switching from the rectified and filtered output to the battery charging current by configuring the sense circuit 32 to switch at a higher rectified and filtered output value. This is beneficial during a power failure but has no effect on transients and results in unwanted battery operation at low AC line and high load conditions.

Figure 4:
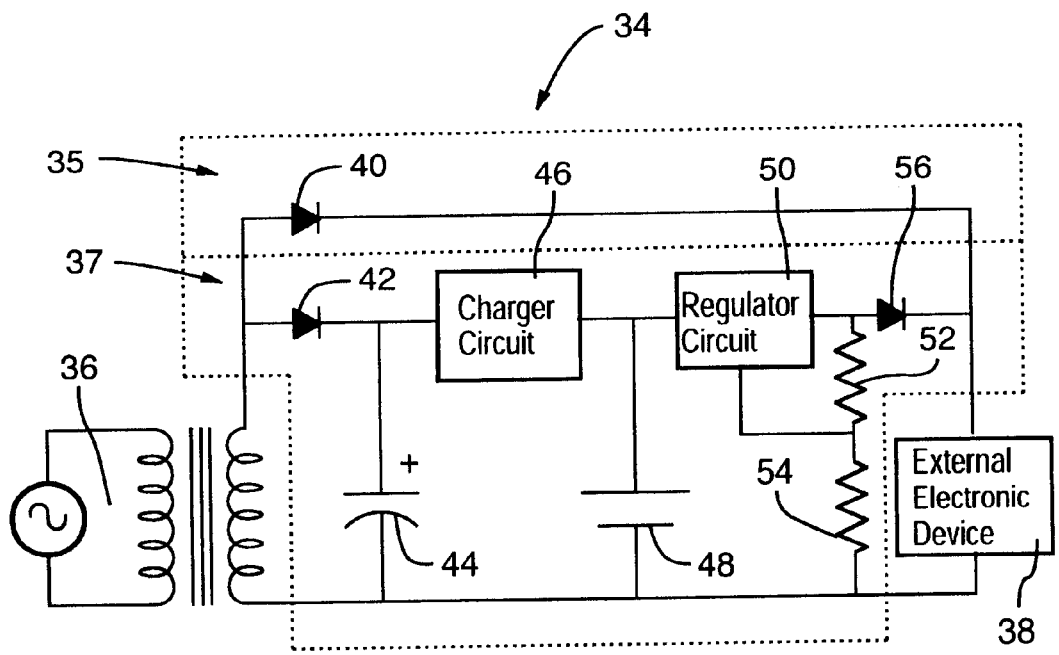
FIG. 4 is a schematic diagram of a preferred embodiment of a battery transfer circuit in accordance with the present invention.

A preferred embodiment of a battery transfer circuit in accordance with the present invention is shown in FIG. 4.

The battery transfer circuit 34 is connected to a power supply 36 and to an electronic device 38, or load. The battery transfer circuit 34 comprises a first circuit 35, in the form of a directly connected diode 40, and a second circuit 37, comprising a charger circuit 46 and regulating means in the form of a regulator circuit 50, a first resistor 52, a second resistor 54 and a regulator diode 56. The second circuit 37 may also include a battery 48, an indirectly connected diode 42 and a capacitor 44.

It will be understood that under normal operating conditions, output from the power supply 36 is directly supplied to the electronic device 38 via the first circuit 35 for powering the electronic device 38 and when a power failure occurs, the electronic device 38 is automatically powered by the second circuit 37.

During normal operation, the power supply output is at least a minimum supply voltage and is rectified by the directly connected diode 40. The power supply output varies depending on the AC line and load regulation characteristics of the power supply 36. For example, the power supply output could vary from 8 to 20 VDC. Apart from the voltage drop across the directly connected diode 40, powering of the electronic device 38 directly results in efficient operation during the presence of AC input power due to the lack of any intervening power conversion stages.

While the power supply output is powering the external electronic device 38, the power supply output is also rectified by the indirectly connected diode 42 and filtered by the capacitor 44 to produce a rectified and filtered output. The rectified and filtered output is supplied to the charger circuit 46 which then uses any one of a number of efficient industry standard power conversion techniques to provide a charge voltage to charge the battery 48 to an optimal charge voltage and an input to the regulator circuit 50. In the present example, with a power supply output of 8 to 20 VDC, the optimal charge voltage is 13.6 VDC but may be adjusted to the requirements of any battery voltage. As mentioned above, by isolating the battery 48 from the electronic device 38, the preferred embodiment is adaptable to various power levels without having to provide a smaller or larger battery due to charging rate requirements.

The regulator circuit 50 uses an electronically controlled series element, such as an industry standard three terminal regulator or equivalent circuit, along with the resistors 52 and 54 to down-regulate the optimal charge voltage to provide and set a predetermined voltage. The regulator diode 56 isolates the regulator circuit 50 and the battery 48 to prevent charging/discharging of the battery 48 by the power supply output. The predetermined voltage is set to coincide with the lower, or minimum limit of the supply voltage, which in the present embodiment is 8.0 V. Therefore, the output voltage threshold for battery operation can be precisely set and no battery charging current flows to the electronic device 38 until the power supply output drops to less than 8.0 VDC. When the power supply output drops below this minimum value, the predetermined voltage is immediately applied to the to the electronic device 38. The predetermined voltage is set such that it is less than the minimum supply voltage during the normal operating condition.

Figure 5:
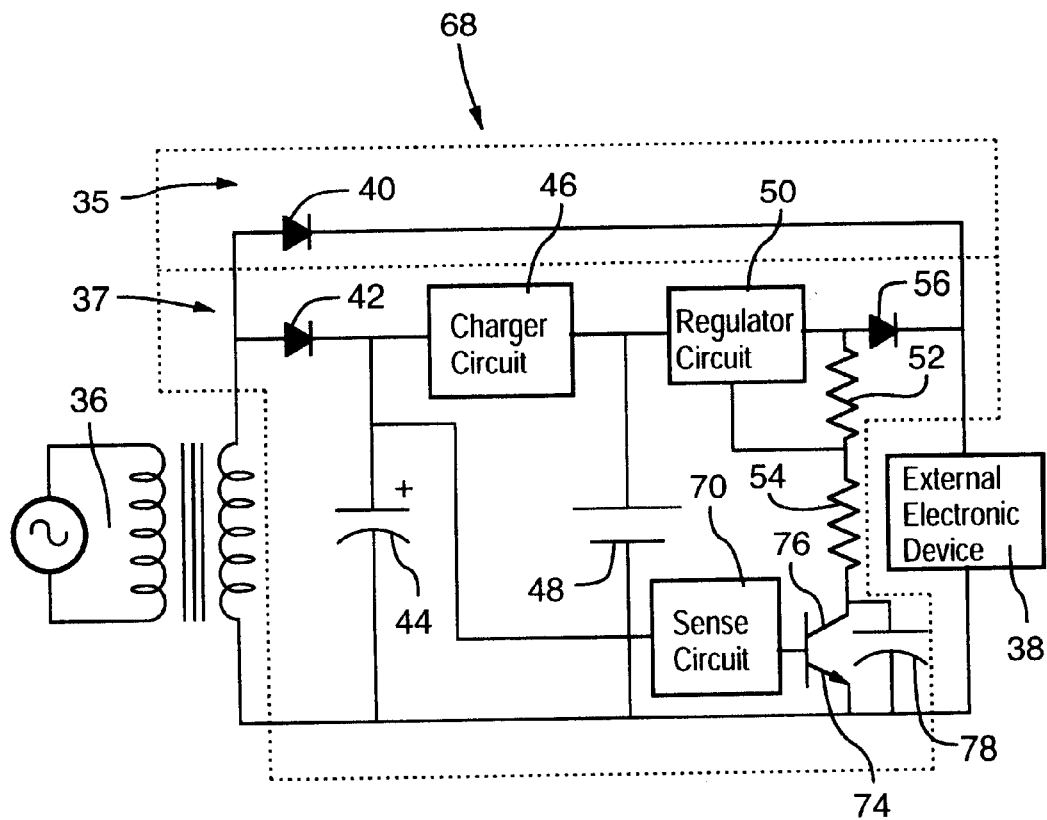
FIG. 5 is a second embodiment of the battery transfer circuit of FIG. 4.

Turning to FIG. 5, a second embodiment of the present invention is shown. Along with the components of the preferred embodiment, the battery transfer circuit 68 further comprises a sense circuit 70. The input of the sense circuit 70 is the rectified and filtered output while the output is connected to a base region 72 of a transistor 74. The collector region 76 of the transistor 74 is connected to the second resistor 54 and a capacitor 78.

In order to improve efficiency, the sense circuit 70 is used to turn off the transistor 74 when a power failure, or disturbance, is sensed which, in turn, has the effect of turning the regulator circuit 50 fully ON. The power failure occurs when the power supply output drops below the minimum supply voltage value. This reduces the voltage drop experienced across the regulator circuit 50 thus increasing the voltage supplied to the electronic device 38 and consequently, battery run time. The capacitor 78 is used to limit the rate of rise of the predetermined voltage and to reduce transients to control the load supplied to the electronic device 38. Unlike prior art control circuits which govern when the output is switched from the power supply 36 to battery power, the timing of the sense circuit 70 is not critical since its function is to increase the efficiency of the battery transfer circuit 68 during prolonged power outages rather than supply instant battery operation in the event of a power failure or disturbance.

Figure 6:
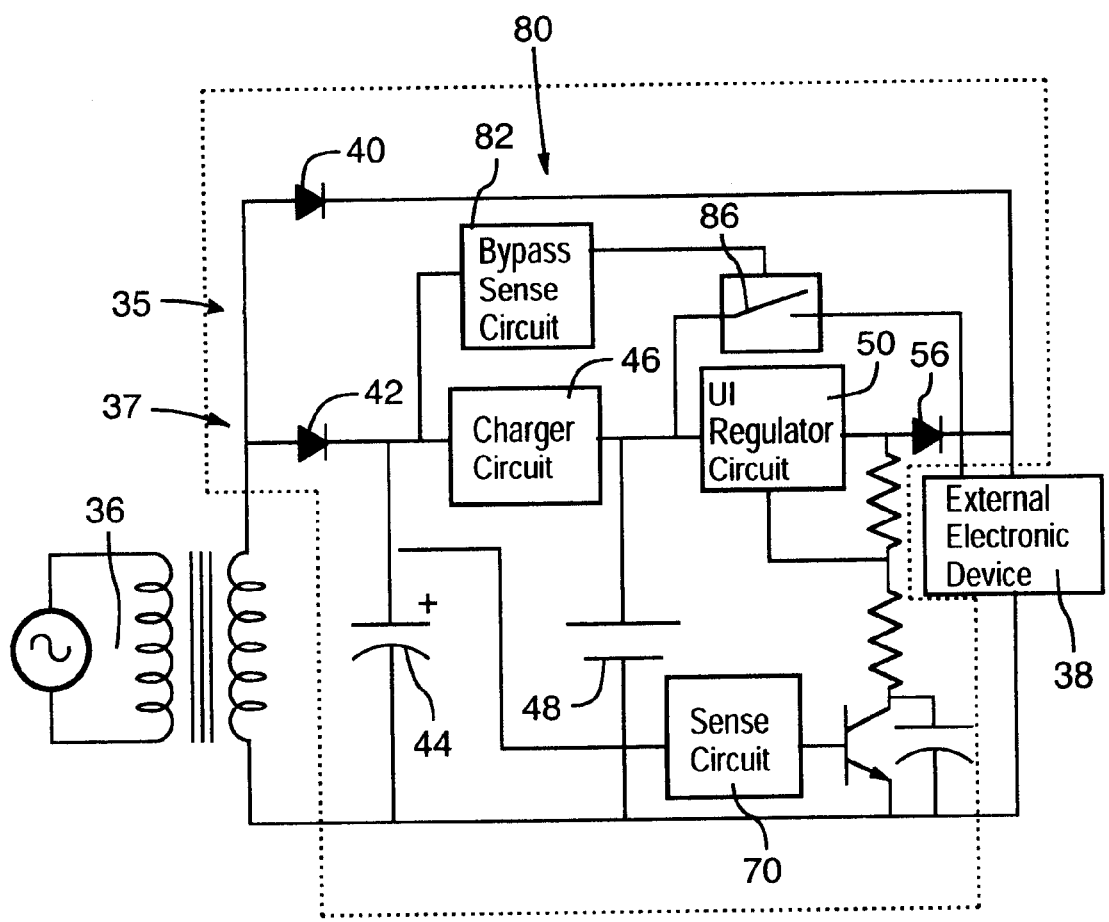
FIG. 6 is a third embodiment of the battery transfer circuit of FIG. 4.

Yet another embodiment of the present invention is shown in FIG. 6. Along with the components of the second embodiment, the battery transfer circuit 80 further comprises a bypass sense circuit 82. Input of the bypass sense circuit 82 is the rectified and filtered output while the bypass circuit output 84 is connected to a relay or electronic switch 86.

The bypass sense circuit 82 and the switch 86 operate to short out the regulator circuit 50 and the regulator diode 56 when a power failure or disturbance is sensed. Although the addition of the bypass sense circuit 82 and the switch 86 produces an abrupt change in the voltage and current supplied to the electronic device 38, the efficiency of the battery transfer circuit 80 is further increased by directly connecting the battery 48 with the electronic device 38. As with the second embodiment, the timing of the bypass sense circuit 82 is not critical.

The bypass sense circuit 82 is configurable to provide a two step mode of operation where the regulator circuit 50 is allowed to turn ON by switching OFF the transistor 74 and then turned OFF by turning the switch 86 ON to directly connect the battery 48 to the electronic device 38. In this embodiment, the increase in the voltage applied to the electronic device during power failure conditions minimizes voltage and current transients which may disturb operation of the electronic device 38.

Figure 7:
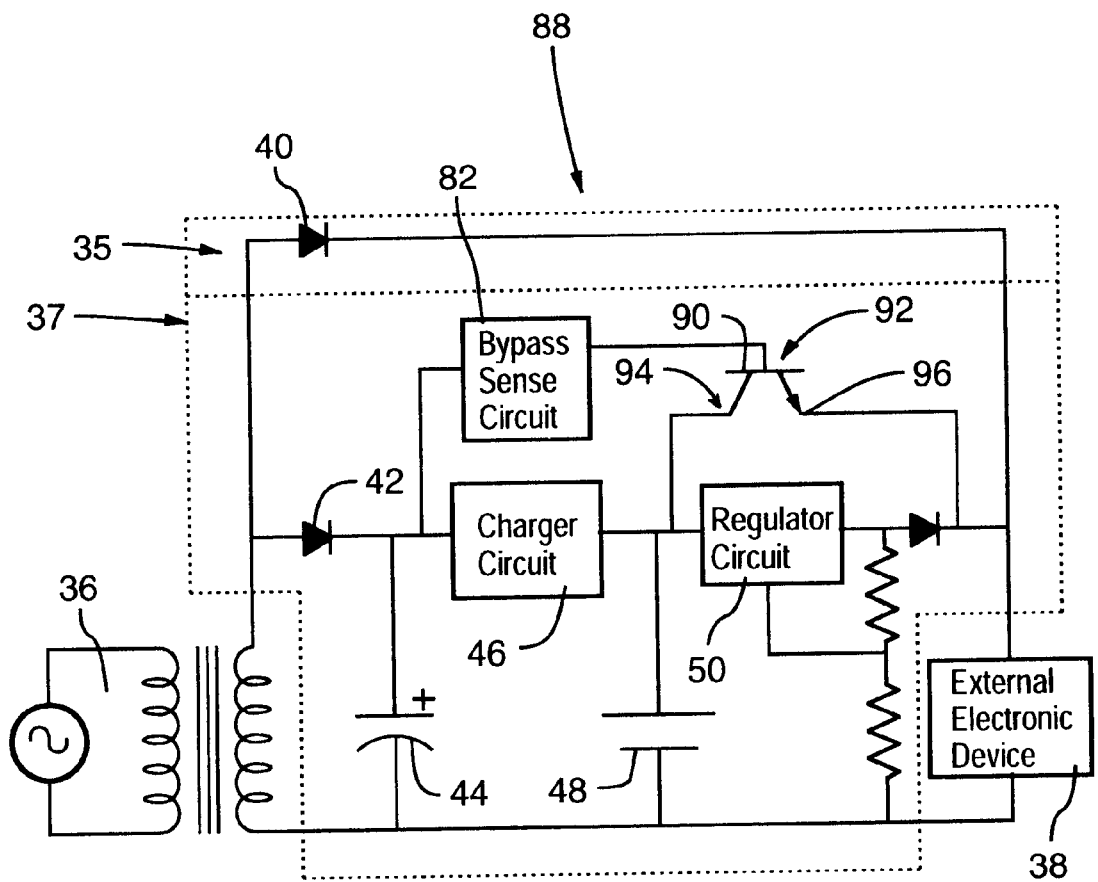
FIG. 7 is a fourth embodiment of the battery transfer circuit of FIG. 4.

A fourth embodiment of the present invention is shown in FIG. 7. Along with the components of the first embodiment, the battery transfer circuit 88 further comprises the bypass sense circuit 82 of FIG. 6. Input of the bypass sense circuit 82 is the rectified and filtered output while the output is connected to a base 90 of a transistor 92.

In this embodiment, the transistor 92 is configured to turn ON slowly when a power failure or disturbance is sensed, such that the voltage drop across the transistor 92 slowly decreases to a minimum value. Although the voltage drop across the transistor 92 in the fully ON state is typically higher than across an equivalent relay circuit, the reduction in efficiency and battery run time is offset by the elimination of voltage and current transients on the output which could disturb the normal operation of the electronic device 38. This embodiment is particularly useful in any application where transfer from one DC power source to another DC power source is required without switching delays.

It will be appreciated that, although various embodiments of the invention have been described and illustrated in detail, various changes and modification may be made. One such modification is that although only a single diode is shown in each of the embodiments, any standard diode configuration could be used to provide a DC output from the AC output of the power supply 36. Similarly, the output of the power supply 36 may be a DC voltage, as in various wall adapter power supplies and therefore, a standard diode bridge circuit may be used to provide automatic polarity correction for the electronic device 38 and the regulator circuit 50. It will also be understood that the charger circuit 46 may be current limited so that a maximum amount of power required to charge the battery does not overload the power supply 36. All such changes and modifications may be made without departing from the sphere and scope of the invention as defined by the claims appended herein.

What is claimed is:

1. A battery transfer circuit connected to a load, a power supply for powering said load with at least a minimum supply voltage during normal operating conditions, and a source of battery voltage for powering said load during a power fail condition when said power supply is unable to power said load at said minimum supply voltage, said battery transfer circuit comprising:

a first circuit for applying at least said minimum supply voltage to said load during said normal operating conditions;

a second circuit for charging said battery to an optimal voltage greater than said minimum supply voltage and for down-regulating said optimal charge voltage to a predetermined voltage less than said minimum supply voltage and for applying said predetermined voltage to said load during said power fail condition.

2. The battery transfer circuit of claim 1 wherein said second circuit comprises:

a charger circuit for charging said battery to said optimal voltage; and regulating means for down-regulating said optimal voltage to said predetermined voltage and for applying said predetermined voltage to said load during said power fail condition.

3. The battery transfer circuit of claim 2 wherein said regulating means comprises:

a regulator circuit for down-regulating said optimal voltage;

a regulator diode for applying said predetermined voltage to said load; and a pair of resistors forming a voltage divider connected to an input of said regulator circuit for controlling said predetermined voltage.

4. The battery transfer circuit of claim 2 further comprising adjustment means to rectify and filter said output from said power supply to provide a rectified and filtered output to said charger circuit.

5. The battery transfer circuit of claim 1 further comprising a direct sense circuit for sensing said power failure condition and in response increasing said voltage applied to said load when said power failure condition is sensed.

6. The battery transfer circuit of claim 1 further comprising a bypass sense circuit for sensing said power failure condition and for providing a direct connection between said battery and said load when said power failure condition is sensed.

7. The battery transfer of claim 6 wherein said bypass sense circuit includes a switch for providing said direct connection.

* * * * *

UNITED STATES PATENT AND TRADEMARK OFFICE
CERTIFICATE OF CORRECTION

PATENT NO. : 6,642,632 B2
DATED : November 4, 2003
INVENTOR(S) : Lucas et al.

It is certified that error appears in the above-identified patent and that said Letters Patent is hereby corrected as shown below:

Title page,
Item [30], Foreign Application Priority Data,
reads "Jun. 22, 2000    (GB)...................0015152"
should read -- Jun. 22, 2000   (GB)...................0015152.2 --.

Signed and Sealed this

Twenty-second Day of June, 2004

JON W. DUDAS
*Acting Director of the United States Patent and Trademark Office*